US012469728B2

(12) United States Patent
Fuller et al.

(10) Patent No.: US 12,469,728 B2
(45) Date of Patent: Nov. 11, 2025

(54) MANIFOLD FOR A SUBSTRATE CONTAINER

(71) Applicant: ENTEGRIS, INC., Billerica, MA (US)

(72) Inventors: Matthew Fuller, Colorado Springs, CO (US); Colton J. Harr, Monument, CO (US); Ian Dutro, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/192,715

(22) Filed: Mar. 4, 2021

(65) Prior Publication Data
US 2021/0280446 A1 Sep. 9, 2021

Related U.S. Application Data

(60) Provisional application No. 62/986,142, filed on Mar. 6, 2020.

(51) Int. Cl.
H01L 21/673 (2006.01)
(52) U.S. Cl.
CPC .. H01L 21/67389 (2013.01); H01L 21/67386 (2013.01)
(58) Field of Classification Search
CPC ......... H01L 21/67389; H01L 21/67386; H01L 21/67393; H01L 21/67379; B65D 25/02
USPC ......................................... 206/710; 220/676
See application file for complete search history.

(56) References Cited

U.S. PATENT DOCUMENTS

| 5,277,579 A * | 1/1994 | Takanabe .......... H01L 21/67109 414/217 |
| 6,368,411 B2 | 4/2002 | Roberson, Jr. et al. |
| 2004/0182472 A1* | 9/2004 | Aggarwal ......... H01L 21/67393 141/98 |
| 2011/0210041 A1* | 9/2011 | Okabe ............... H01L 21/67393 206/710 |
| 2013/0121851 A1* | 5/2013 | Kim .................. H01L 21/67393 417/65 |
| 2015/0243538 A1* | 8/2015 | Miyajima ......... H01L 21/67772 206/711 |
| 2016/0118282 A1* | 4/2016 | Maraschin ........ H01L 21/67769 206/711 |

(Continued)

FOREIGN PATENT DOCUMENTS

CN 110858559 A 3/2020
JP 2003170969 A 6/2003
(Continued)

Primary Examiner — Orlando E Aviles
Assistant Examiner — Jenine Pagan

(57) ABSTRACT

A substrate container includes a shell defining an interior space and a manifold with an inlet and a gas distributing surface. The shell includes a front opening, a bottom wall, and a rear wall. The manifold is attached to the bottom wall and is closer to the front opening than the rear wall. The gas distributing surface is configured to distribute purge gas into the interior space. A method of purging an open substrate container includes supplying a first stream of purge gas to a manifold and supplying a second stream of purge gas to an interior space of the substrate container. The method also including the manifold distributing the purge gas of the first stream within the interior space of the substrate container.

15 Claims, 14 Drawing Sheets

(56) References Cited

U.S. PATENT DOCUMENTS

| | | | |
|---|---|---|---|
| 2016/0141194 A1* | 5/2016 | Kirkland | H01L 21/67386 206/710 |
| 2018/0315632 A1* | 11/2018 | Taniyama | H01L 21/67775 |
| 2019/0229000 A1* | 7/2019 | Kuan | H01L 21/67389 |
| 2019/0341282 A1* | 11/2019 | Kim | H01L 21/67242 |
| 2020/0033308 A1* | 1/2020 | Kotsugai | H01L 21/67253 |
| 2020/0066562 A1 | 2/2020 | Son | |
| 2020/0105565 A1* | 4/2020 | Son | H01L 21/67393 |
| 2021/0235583 A1* | 7/2021 | Yang | H01L 21/67389 |

FOREIGN PATENT DOCUMENTS

| | | | |
|---|---|---|---|
| JP | 2012033702 A | 2/2012 | |
| KR | 101366135 B1 | 2/2014 | |
| KR | 20190122040 A | 10/2019 | |
| KR | 20200008492 A | 1/2020 | |
| TW | 201219102 A | 5/2012 | |
| TW | 201943888 A | 11/2019 | |

* cited by examiner

MANIFOLD FOR A SUBSTRATE CONTAINER

CROSS-REFERENCE TO RELATED APPLICATION

This application claims the benefit of and priority to U.S. Provisional Application No. 62/986,142 filed on Mar. 6, 2020, which is incorporated herein by reference in its entirety for all purposes.

FIELD

This disclosure relates generally to a substrate container with a front opening. More specifically, this disclosure relates to supplying purge gas to the interior of container.

BACKGROUND

Substrates in the form of wafers can be processed to form semiconductor devices. The wafer substrates, or simply substrates, undergo a series of process steps. Exemplary process steps can include, but are not limited to, material layer deposition, doping, etching, or chemically or physically reacting material(s) of the substrate. A substrate container is used to store and transport the in-process wafers between process steps within the fabrication facility. During some process steps, the substrates are processed by processing equipment within a clean environment (e.g., a clean room). Substrates can be transferred from the substrate container to the processing tool through an equipment front end module (EFEM). The EFEM generally includes a load port for receiving the substrate container, a transfer unit, a frame or "mini-environment", and a fan filter unit used to generate gas flow within the EFEM.

In use, the substrate container is docked on a load port, and the door of the EFEM 18 is opened. Next, the door is disengaged from the substrate container which permits the transfer unit housed within the EFEM to access the substrates contained within the substrate container for processing. A flow of gas introduced by the fan filter unit Gas flows through the EFEM in a direction from a top of the EFEM to a bottom of the EFEM. When the front opening of the substrate container interfaces with the load port opening of the EFEM some of the gas flowing through the EFEM and across the load port opening may be inadvertently directed into the interior of the container, potentially interfering with the purging capabilities of the substrate container by temporarily causing an increase in the relative humidity and/or oxygen levels within the microenvironment of substrate container, which can be undesirable.

SUMMARY

In an embodiment, a method of purging an open front opening substrate container includes supplying a first stream of purge gas to an inlet of a manifold within the substrate container, the manifold distributing the purge gas within an interior space, and supplying a second stream of purge gas to the interior space. The first stream is suppled via a front inlet port that is closer to the front opening than a rear wall of the substrate container. The second stream is supplied via a rear inlet port that is closer to the rear wall than the substrate container.

In an embodiment, a substrate container includes a shell and a manifold. The shell defines an interior space and includes a front opening, a first side wall, a second side wall, a rear wall, and a bottom wall. The bottom wall has a front edge that extends between the first side and the second side wall and along the front opening of the shell. The manifold can be attached to any one of the bottom, top or a sidewall or some combination thereof. In one embodiment, the manifold is attached to the bottom wall and is closer to the front opening than to the rear wall. The manifold includes an inlet for receiving purge gas and a gas distributing surface configured to the distribute the purge gas within the interior space. The gas distributing surface includes a first gas distributing portion that extends in a direction between the first side wall and the second side wall. In another embodiment, the manifold includes an outlet for exhausting a purge gas.

BRIEF DESCRIPTION OF THE DRAWINGS

Both described and other features, aspects, and advantages of a substrate container and a method of purging a substrate container will be better understood with the following drawings.

Figure 1:
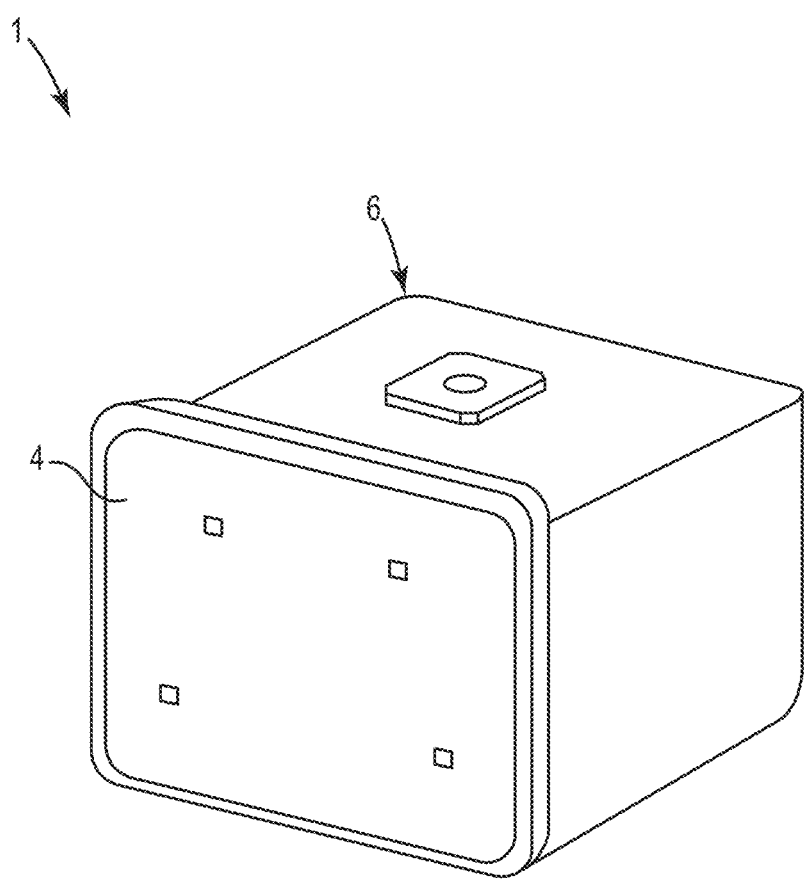
FIG. 1 is a front perspective view of an embodiment of a substrate container.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

This disclosure generally relates to a front manifold for a substrate container having a front opening for accessing the interior space of the substrate container. The substrate container used for carrying substrates, such as, during semiconductor manufacturing. More specifically, this disclosure relates to a manifold configured to distribute purge gas within an interior space to prevent ingress of gas into the front opening of the substrate container while open. In some embodiments, the manifold may be configured as an outlet to facilitate the exhaustion of purge gas from the substrate container when the substrate container is closed.

Substrates in the form of wafers can be processed to form semiconductor devices. A substrate container is a container for carrying the substrates during processing. The substrates can be stored within a substrate container before and during the different process steps. The substrate container is accessed through a front opening of the substrate container. The substrate container may be, for example, a front opening unified pod (FOUP).

Figure 2A:
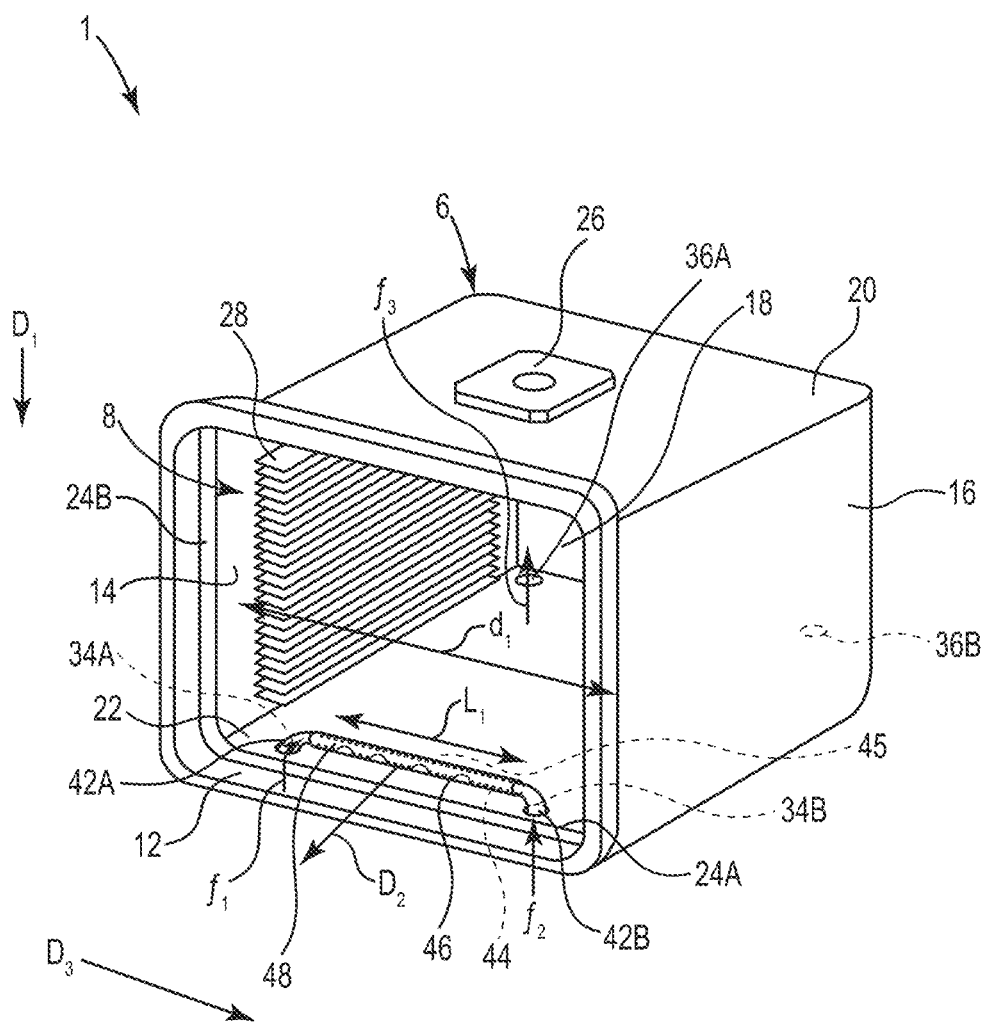
FIG. 2A is a front perspective view of the substrate container in FIG. 1 when open, according to an embodiment.
Figure 2B:
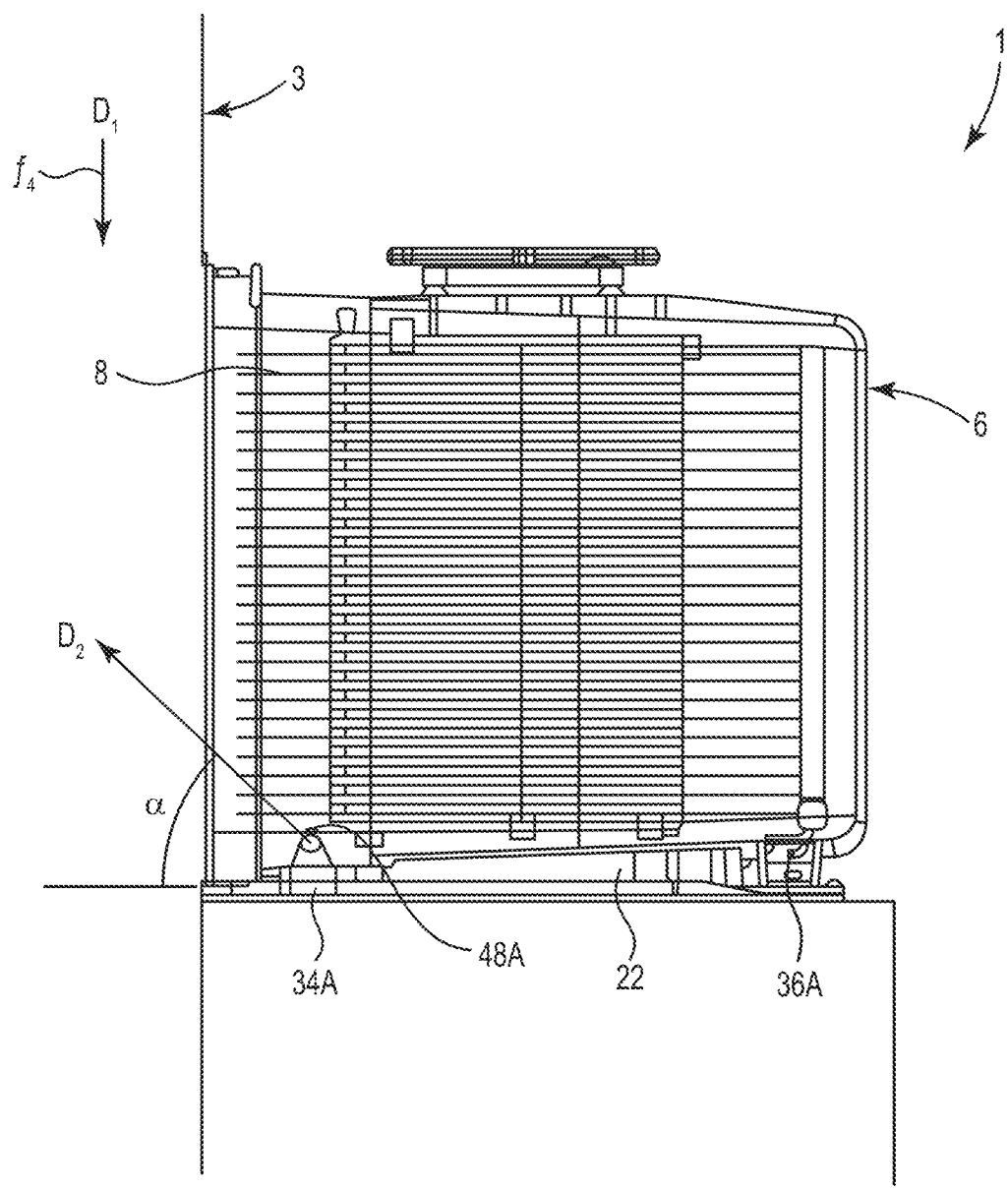
FIG. 2B is a cross sectional view of the substrate container in FIG. 2A when attached to an equipment front end module, according to an embodiment.
Figure 3:
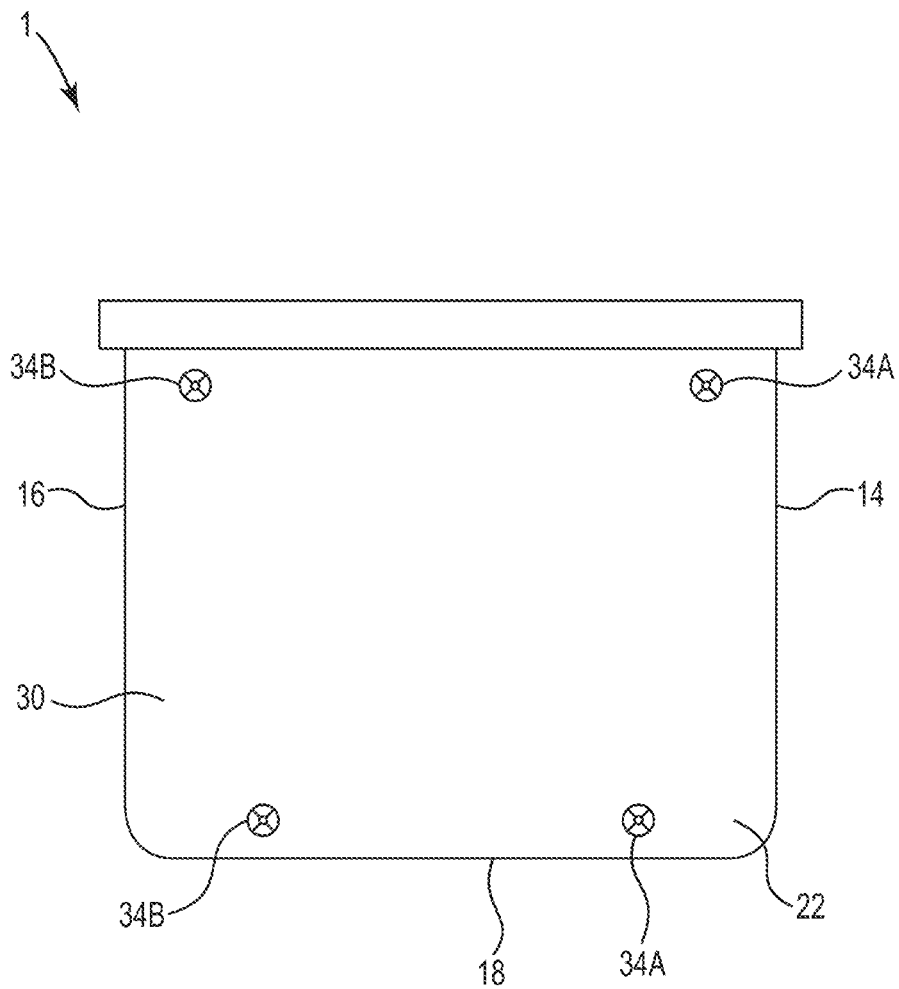
FIG. 3 is a bottom view of the substrate container in FIG. 1, according to an embodiment.

FIGS. 1-3 show a substrate container 1 according to an embodiment of the disclosure. FIGS. 1 and 2A are each a front perspective view of the substrate container 1. FIG. 2B is a cross sectional view of the substrate container 1 when attached to an equipment front end module 3. FIG. 3 is a bottom view of the substrate container 1. Dashed lines are provided in the figures to indicate obscured features (e.g., edges, openings, etc.). As shown in FIG. 1, the substrate container 1 includes a front door 4 and a shell 6. The front door 4 is received within a front opening 12 of the shell 6 and forms an enclosed interior space 8. The interior space 8 is discussed in more detail below.

FIG. 2A illustrates the substrate container 1 with the front door 4 removed (e.g., opened). As shown in FIG. 2A, the shell 6 defines an interior space 8 of the substrate container 1. Substrates (e.g. substrates 590 in FIG. 8A) are stored in the interior space 8 of the substrate container 1. The shell 6 includes a front opening 12. The door 4 is received within the front opening 12 of the shell 6, blocking the front opening 12. The substrate container 1 can be accessed by moving (e.g., opening, removing) the door 4. For example, the door 4 in FIG. 1 is received in the shell 6 by inserting the door 4 into the shell 6. In an embodiment, one or more of the door 4 and the shell 6 can include a locking mechanism (not shown) to prevent accidental removal of the door 4.

As shown in FIG. 2A, the shell 6 includes a front opening 12, a first side wall 14, a second side wall 16, a rear wall 18, and a top wall 20, and a bottom wall 22. The first side wall 14 is opposite to the second side wall 16, and the top wall 20 is opposite the bottom wall 22. The first side wall 14 can be referred to as the left side while the second side wall 16 can be referred to as the right side. The top wall 20 and bottom wall 22 each extend between the first side wall 14 and the second side wall 16. The shell 6 includes a front edge extending between opposing walls. The bottom wall 22 includes a front edge 24A that extends along the front opening 12. The front edge 24A also extends between the first side wall 14 and the second side wall 16 of the shell 6. The first side wall 14 includes a front edge 24B that extends along the front opening 12. The front edge 24B of the first side wall 14 also extends between the top wall 20 and the bottom wall 22 of the shell 6. As shown in FIG. 2A, the front edges 24A, 24B in an embodiment are each directly adjacent to the front opening 12.

The substrate container 1 can include an equipment hookup 26 on the top wall 20 of the shell 6. In an embodiment, the equipment hookup 26 allows a standard automated attachment (not shown) for moving the substrate container 1, such as but not limited to an automated arm, to be connected to the substrate container 1. For example, the automated arm may be used to move the substrate container 1 between different processing equipment. In an embodiment, the substrate container 1 may include one or more handles (not shown) to allow a user (e.g., a technician, etc.) to manually move the substrate container 1.

The substrate container 1 can include a plurality of shelves 28 for holding substrates (not shown) in the interior space 8. The portions of the shelves 28 on the second side wall 16 are obscured in FIG. 2A, which can have a similar configuration to the portions on the shelves 28 on the first side wall 14 (e.g., the slots in the substrate container of FIG. 7A). The shelves 28 are sized to each hold a substrate (not shown) within the interior space 8. For example, the shelves 28 in an embodiment are sized to hold a specific size of substrate (e.g., 150 mm wafers, 200 mm wafers, etc.).

When the substrate container 1 is open, purge gas can be supplied to the interior space 8 to reduce ingress of the external environment (e.g., gas, particles, humidity, etc.) through the front opening 12 into the substrate container 1. For example, the supplied purge gas is configured to flow out from interior space 8 through the front opening 12, which helps minimize any inward flows into the interior space 8 through the front opening 12. The purge gas may be a generally inert gas. The purge gas can include, for example, but is not limited to, one or more of nitrogen, clean dry air (CDA), and extra clean dry air (xCDA).

Conversely, purge gas may continue to be supplied to the interior space 8 of the substrate container 1 when the door 4 is received within the front opening 12 and the substrate container 1 is closed. The purge gas can be exhausted to the exterior of the substrate container 1 through one or more manifolds, such as described herein according to the various embodiments, that may serve as both an inlet and an outlet or as an outlet only depending on the configuration and desired application. A positive pressure of purge gas within the interior space 8 creates a diffusion gradient facilitating the flow of purge gas from the interior space through the one or more outlets and out of the substrate container. In some embodiments, the manifold(s) may include a check valve that permits the introduction of air into the interior space 8 and/or permits the exhaustion of air from out of the interior space depending on directional flow of the air.

The substrate container 1 includes a plurality of inlet ports 34A, 34B, 36A, 36B for supplying the purge gas into the interior space 8. For example, the substrate container 1 is configured to be supplied with a first stream of purge gas $f_1$ through a first inlet port 34A, a second stream of purge gas $f_2$ through a second inlet port 34B. Another stream of purge gas $f_3$ is supplied to the rear inlet port 36A. The substrate container 1 includes a front manifold 40 that distributes first stream of purge gas purge gas $f_1$ into the interior space 8. The front manifold 40 in FIG. 2A also distributes the second stream of purge gas $f_2$.

FIG. 2B is a cross-sectional view of the substrate container 1 when attached to an equipment front end module 3. When a substrate container 1 is attached to the equipment front end module 3, the front opening 12 is positioned along the interior of the equipment front end module. A flow of gas $f_4$ (e.g., xCDA or nitrogen) is continuously directed through the interior of the equipment front end module 3 to reduce contaminants within the equipment front end module 3. The flow of gas $f_4$ flows past the front opening 12 (e.g., in direction $D_1$). The front manifold 40 is configured to distribute purge gas along the front opening 12 to counter the turbulent flows of the gas into the interior space 8 through the front opening 12. The ingress of gas flowing through the equipment front end module may temporarily cause an increase in the relative humidity and/or oxygen levels within the microenvironment of substrate container, which is undesirable. The front manifold 40 is discussed in more detail below.

As shown in FIG. 3, the bottom wall 22 includes the inlet ports 34A, 34B, 36A, 36B. The shell 6 has an external surface 30. For example, the bottom wall 22 forms a portion of the external surface 30. The inlet ports 34A, 34B, 36A, 36B each extend from the interior space 8 (shown in FIG. 2A) through the bottom wall 22 to the external surface 30 of the shell 6. The substrate container 1 includes four inlet ports 34A, 34B, 36A, 36B. However, the substrate container 1 in an embodiment may include a different number of the inlet ports 34A, 34B, 36A, 36B. In an embodiment, the substrate container 1 may include one or more inlet ports 34A, 34B, 36A, 36B. In an embodiment, the substrate container 1 may include one or more front inlet ports 34A, 34B and one or more rear inlet ports 36A, 36B. In an embodiment, the substrate container 1 may include a distributing structure (not shown) for each of the rear inlet ports 36A, 36B. In an embodiment, one of the front ports 34A, 34B may be an outlet port for discharging gas in the interior space 8 out of the substrate container 1.

As shown in FIG. 2A, the front manifold includes 40 includes a first inlet 42A, a second inlet 42B, a frame 44, and a gas distributing surface 46. The first inlet 42A of the manifold 40 is attached to the first inlet port 34A. The second inlet 42B of the manifold 40 is attached to the second inlet port 34B. The front manifold 40 in FIG. 2A connects to two inlet ports 34A, 34B. However, the front manifold 40 in an embodiment may connect to one or more inlet ports 34A. In an embodiment, the front manifold 40 may connect to a single inlet port 34A. In such an embodiment, the front manifold 40 may have a single inlet 42A connected to the single inlet port 34A.

The gas distributing surface 46 in FIG. 2A is wrapped around the frame 44. As show in FIG. 2, the frame 44 has a generally cylindrical shape. The frame 44 has a plurality of openings 45 disposed along the length $L_1$ of the gas distributing surface 46. For example, the openings 45 are disposed in the lateral surface of the generally cylindrical shaped frame. The purge gas flows within the frame 44 exits the frame through the opening(s) 45, flows through the portions (s) of the distributing surface 46 that cover the opening(s) 45, and is distributed into the interior space 8.

In an embodiment, the gas distributing surface 46 is made of a porous material. In an embodiment, the gas distributing surface 46 is made of a porous material. A porous material is material that includes channels formed by microscopic open voids. The porous materials may include, for example, but are not limited to, a non-woven polymer, a sintered polymer material, and a polymer membrane. For example, a sintered polymer material is formed by at least sintering polymer particles together. The polymers are those suitable for use in handling of semiconductor wafers, such as, but not limited to polytetrafluoroethylene (PTFE), unsaturated polyethylene (UPE), and polyethylene.

The purge gas flowing into manifold 40 is distributed by the gas distributing surface 46. The gas distributing surface 46 is configured to distribute the purge gas flowing into the manifold 40 (e.g., the first stream of purge gas $f_1$, the second stream of purge gas $f_2$) into the interior space 8. In an embodiment, the gas distributing surface 46 is configured to distribute a portion of the purge gas into the interior space 8 in the direction $D_2$ that is towards the front opening 12. In an embodiment, manifold 40 may include a deflector (not shown) to direct the purge gas flowing from the gas distributing surface 46 in the direction $D_2$. In such an embodiment, the deflector may be a snap on deflector that attaches by snapping onto the frame 44.

As shown in FIG. 2A, the gas distributing surface 46 has a first gas distributing portion 48A that extends in a direction $D_S$ between the first side wall 14 and the second side wall 16 of the shell 6. The first gas distributing portion 48A also extends along the front edge 24A of the bottom wall 22 of the shell 6. The first gas distributing portion 48A has a length $L_1$ that extends along a majority of the distance di between the first side wall 14 and the second side wall 16.

As shown in FIG. 2B, the first gas distributing portion 48A of the gas distributing surface 46 distributes a portion of the purge gas into the interior space 8 in the direction $D_2$ that is at an angle $\alpha$ relative to the bottom wall 22 of the shell 6. The angle $\alpha$ in FIG. 2B is 30 degrees relative to the bottom wall 22. In an embodiment, the first gas distributing portion 48A distributes from 1 to 50 liters per minute (LPM) at an angle $\alpha$ from 0 to 180 degrees ($0 \leq \alpha \geq 180$) relative to the bottom wall 22. In an embodiment, the first gas distributing portion distributes a portion of the purge gas at an angle $\alpha$ that is 90 degrees or is less than 90 degrees and greater than 0 degrees ($0 < \alpha \geq 90$) relative to the bottom wall 22. In an embodiment, the first surface distributing surface portion 48A is configured to distribute from 3 to 300 LPM of purge gas. In an embodiment, the first distributing surface is configured to distribute from 3 to 300 LPM of purge gas in the direction $D_2$.

Figure 4:
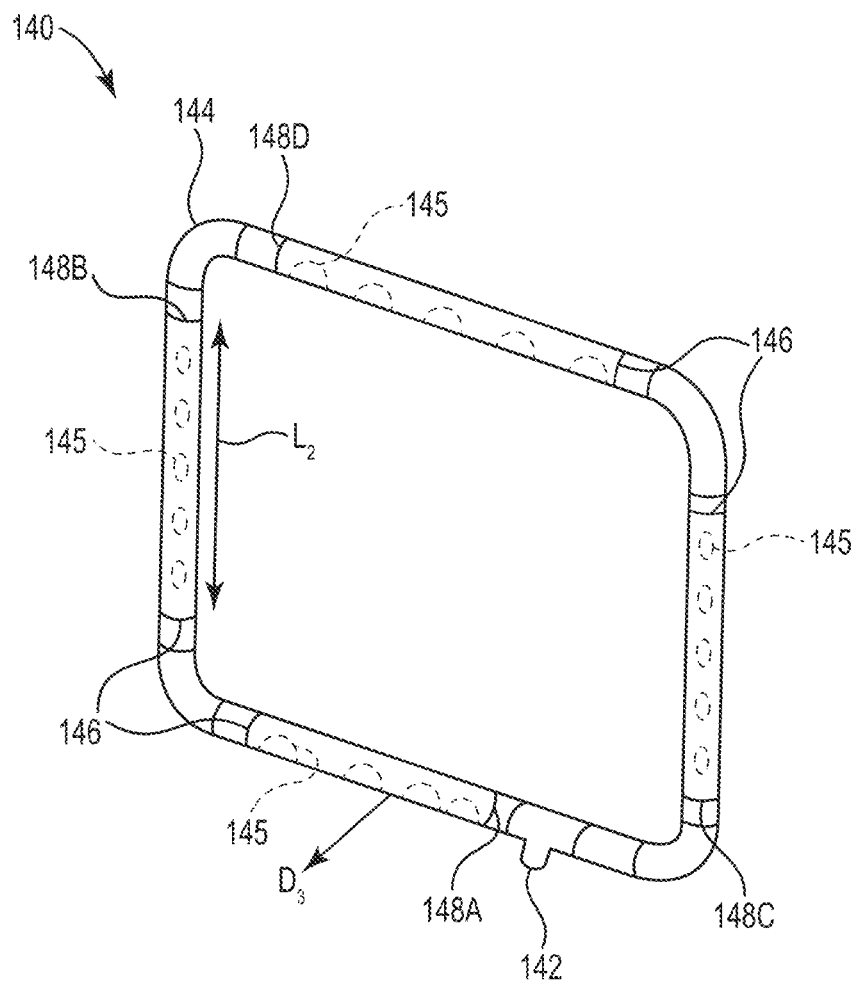
FIG. 4 is a front perspective view of an embodiment of a manifold for a substrate container.

FIG. 4 is a front perspective view of a front manifold 140 according to another embodiment of the disclosure. The manifold 140 is attached to within the interior space of a substrate container in a similar manner to the front manifold 40 of FIG. 2, except as described below. The manifold 140 is configured to disperse purge gas into the interior space along the front opening of its substrate container as similarly discussed for the manifold 40 in FIG. 2.

The manifold 140 includes an inlet 142, a frame 144, and a distributing surface 146. The inlet 142 attaches to a front inlet port in a bottom wall of a shell of a substrate container (e.g., front inlet port 34A, front inlet port 34B). The inlet 142 configured to receive a stream of purge gas passing through the front inlet port (e.g., first stream of purge gas $f_1$, second stream of purge gas $f_2$). The manifold 140 in FIG. 4 includes a single inlet 142. However, the manifold 140 in an embodiment may include a plurality of inlets 142. For example, the manifold 140 in an embodiment may include two inlets similar to the manifold 40 in FIG. 2.

The distributing surface 146 can include a first gas distributing portion 148A, a second gas distributing portion 148B, a third gas distributing portion 148C, and a fourth gas distributing portion 148D. Each of the surface distributing portions 148A-D are located adjacent to, and in some cases, attached to, a different wall of the interior space of the substrate container adjacent to the front opening (e.g., first side wall 14, second side wall 16, top wall 20, bottom wall 22). The first gas distributing portion 148A has a similar position to the first gas distributing portion 48A in FIG. 2A. The second gas distributing portion 148B is configured to extend along a second side wall of the shell of the substrate container (e.g., first side wall 14 of the shell 6).

The second gas distributing portion 148B extends between the top wall and bottom wall of the shell (e.g., between the top wall 20 and bottom wall 22 of the shell 6). The second gas distributing portion 148B also extends along the front edge of a first side wall of the shell (e.g., along the front edge 24B of the first side wall 14 of the shell 6). The second gas distributing portion 148B has a length $L_2$ that extends along a majority of the distance between a top wall and a bottom wall of the shell (e.g., along a majority of the distance between the top wall 20 and the bottom wall 22 of the shell 6).

The third gas distributing portion 148C is positioned along the second side wall of the shell (e.g., the second side wall 16 of the shell 6) in a similar manner as discussed above with respect to the second gas distributing portion 148B and the first side wall of the shell. The fourth gas distributing portion 148D is positioned along the top wall of the shell (e.g., the top wall 20 of the shell 6) in a similar manner as discussed above with respect to the second gas distributing portion 148B and the first side wall of the shell.

In some embodiments, as depicted in FIG. 4, the gas distributing surface 146 is wrapped around a frame 144 in a similar manner as discussed above with respect to the gas distributing surface 46 and frame 44 in FIG. 2. The frame 144 includes opening(s) 145 as similarly to the openings 45 in FIG. 2. The openings 145 are positioned along the length of the length of each portion of the gas distributing surface 146. For example, the frame 144 includes opening(s) 145 along each of the surface distributing portions 148 A-D. In other embodiments, the gas distributing portions 148A-D can be configured similarly to those gas distributing portions shown and described with reference to FIGS. 6A and 6B below and can include a membrane or porous material surrounded by a frame.

In an embodiment, one or more of the surface distributing portions 148 A-D is configured to distribute a portion of the purge gas into the interior space in a direction $D_3$ that is towards the front opening of the shell (e.g., towards the front opening 12 of the shell 6). In an embodiment, each of the surface distributing portions 148 A-D is configured to distribute a portion of the purge gas into the interior space in a direction $D_3$ that is towards the front opening of the shell.

Figure 5A:
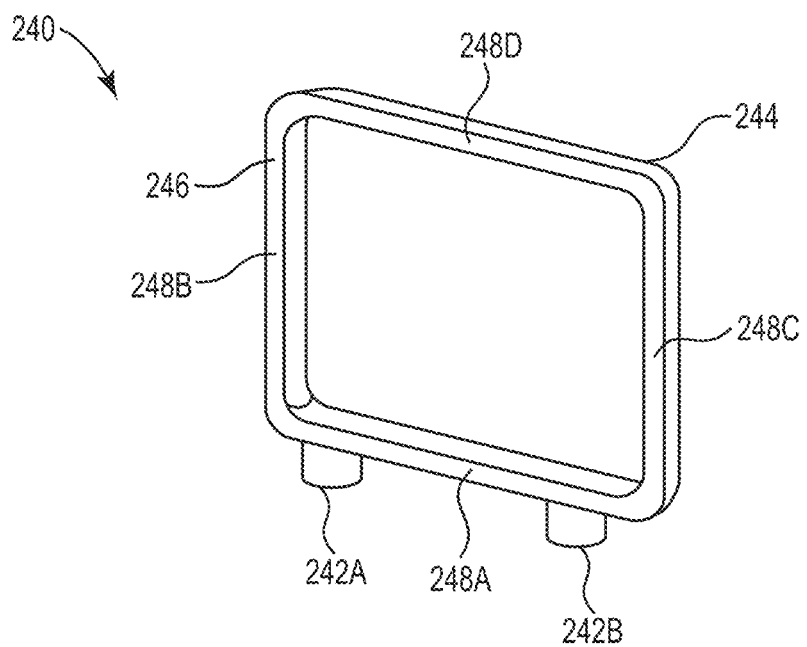
FIG. 5A is a front perspective view of an embodiment of a manifold for a substrate container.
Figure 5B:
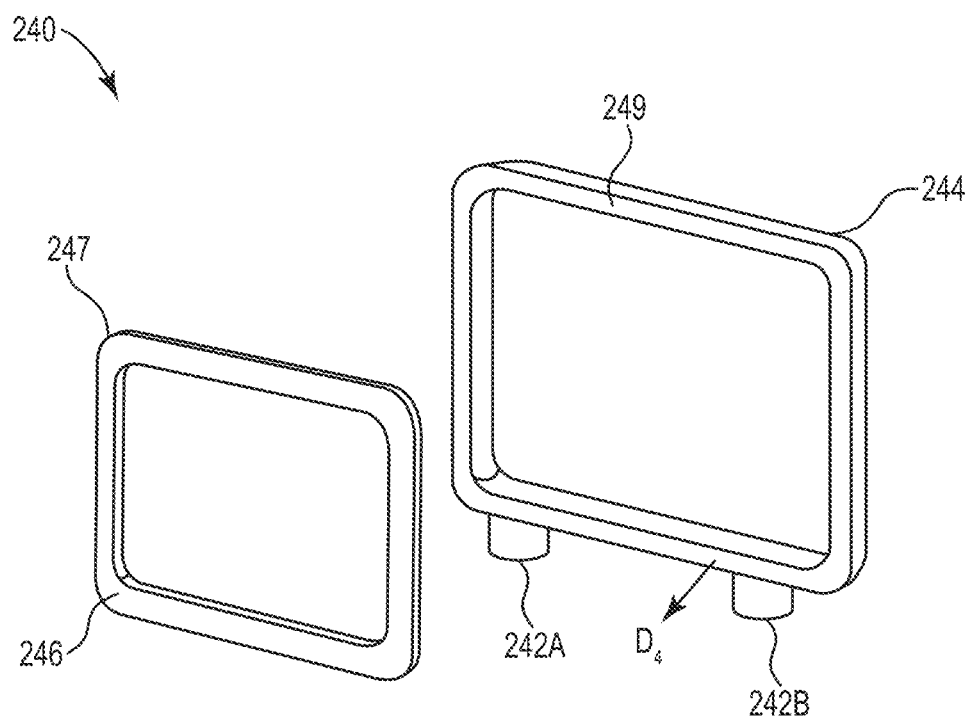
FIG. 5B is an exploded view of the manifold in FIG. 5A.

FIGS. 5A and 5B show a front manifold 240 according to another embodiment of the disclosure. FIG. 5A is a front perspective view of the front manifold 240. FIG. 5B is an exploded view of the front manifold 240. The manifold 240 is attached within the interior space of a substrate container in a similar manner to the front manifold 40 of FIG. 2A, except as described below. The manifold 240 is configured to disperse purge gas into the interior space along the front opening of its substrate container as similarly discussed for the manifold 40 in FIG. 2A.

The manifold 240 includes two inlets 242A, 242B, a frame 244, and a membrane 247. The membrane 247 includes a gas distributing surface 246. The inlets 242A, 242B attach to a first front inlet port and a second front inlet port in a bottom wall of a shell of a substrate container (e.g., first front inlet port 34A, second front inlet port 34B). The inlets 242A, 242B are each configured to receive a respective stream of purge gas passing through their respective front inlet port (e.g., first stream of purge gas $f_1$, second stream of purge gas $f_2$). The manifold 240 in FIGS. 5A and 5B includes two inlets 242A, 242B. However, the manifold 240 in an embodiment may include a different number of inlets 242A, 242B. For example, the manifold 240 in an embodiment may include a single inlet 242A, 242B similar to the manifold 140 in FIG. 4.

The gas distributing surface 246 includes a first gas distributing portion 248A, a second gas distributing portion 248B, a third gas distributing portion 248C, and a fourth gas distributing portion 248D. Each of the surface distributing portions 248A-D extends along a different wall of the interior space of the substrate container adjacent to the front opening (e.g., first side wall 14, second side wall 16, top wall 20, bottom wall 22). For example, the first gas distributing portion 248A has a similar position to the first gas distributing portion 48A in FIG. 2. For example, the second gas distributing portion 248B, the third gas distributing portion 248C, and the fourth gas distributing portion 248D each have a similar position as discussed above for the second gas distributing portion 148B, the third gas distributing portion 148C, and the fourth gas distributing portion 148D of the manifold 140 in FIG. 4.

FIG. 5B illustrates the membrane 247 when separate from the frame 244. In an embodiment, the membrane 247 may be attached to the frame 244. The membrane 247 can be attached to the frame 244 by, for example, but not limited to, heat bonding. In an embodiment, the membrane 247 may be a die cut membrane or a membrane film. A membrane is an example of a porous material. In an embodiment, the porous material may be one of a non-woven polymer, a sintered polymer material, and a polymer membrane (e.g., membrane 247). The membrane 247 includes one or more polymers. The polymer(s) of the membrane 247 are those suitable for use in handling of semiconductor wafers, such as, but not limited to polytetrafluoroethylene (PTFE), unsaturated polyethylene (UPE), and polyethylene. In an embodiment, the sintered material or the nonwoven polymer may be used instead of the membrane 247.

The frame 244 includes a channel 249. The membrane 247 is positioned along the channel 249. The purge gas from the inlet(s) 242A, 242B flows through the channel 249 then passes through the membrane 247 to exit the manifold 240. The membrane 247 distributing the purge gas into the interior space. More specifically, the distributing surface 246 of the membrane 247 distributes the purge gas into the interior space.

The front manifold 240 is configured so that the gas distributing surface 246 distributes at least a portion of the purge gas in a direction $D_4$ that is towards the front opening of the shell of the substrate container (e.g., front opening 12). In an embodiment, the frame 244 may be configured to angle the direction $D_4$ at which purge gas is distributed the gas distributing surface 246.

The manifold 240 in FIGS. 5A and 5B is configured to extend along the entire perimeter of the front opening of the substrate container. However, the manifold 240 in an embodiment may be configured to extend along one or more walls of the substrate container. For example, the manifold 240 in an embodiment may extend along just the bottom wall of the substrate container (e.g., bottom wall 22 of the shell 6) similar to the manifold 40 in FIG. 2.

Figure 6A:
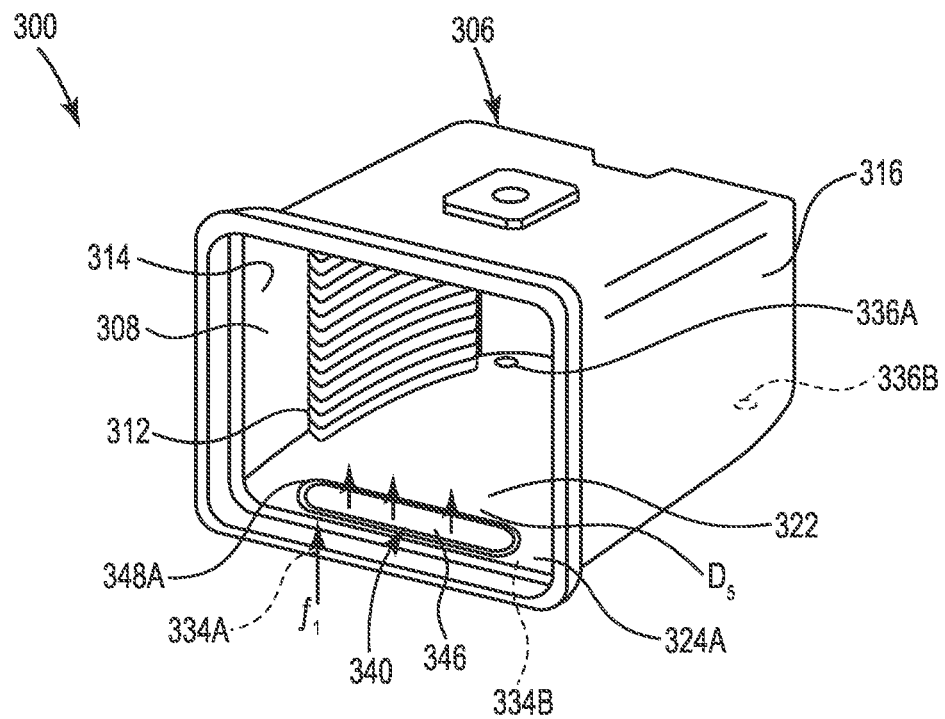
FIG. 6A is a front perspective view of an embodiment a substrate container.

FIG. 6A is a front perspective view of an embodiment of a substrate container 300. The front door of the substrate container 300 is removed in FIG. 6A (e.g., the substrate container 300 is open). The substrate container 300 is closed with a front door similar to the front door 4 in FIG. 1. The substrate container 300 includes a shell 306 and a front manifold 340. The substrate container 300 can have a similar structure and configuration to substrate container 1 in FIGS. 1-3, except with respect to the front manifold 340. For example, the substrate container 300 includes an interior space 308, a front opening 312, a first side wall 314, and a second side wall 316, a bottom wall 322 with a front edge 324A, and ports 334A, 334B, 336A, 336B in the bottom wall 322 of the shell 306 similar to the substrate container 1 in FIGS. 1-3. In an embodiment, the substrate container 300 and its shell 306 may have features (e.g., additional inlets, single rear inlet, slots, etc.) as similarly discussed above with respect to the substrate container 1 in FIGS. 1-3.

As shown in FIG. 6A, a first stream of purge gas $f_1$ can be supplied to substrate container 300 through a first inlet port 334A in the bottom wall 322 of the shell 306. The front manifold 340 is configured to distribute the purge gas into the interior space 308. The first inlet port 334A can be attached to the inlet port 42A. The manifold 340 includes a gas distributing surface 346. The purge gas flowing into manifold 340 is distributed by the gas distributing surface 346. A portion of the purge gas is directed in an upward direction $D_5$ from the gas distributing surface 346.

The gas distributing surface 346 includes a first gas distributing portion 348A that extends along the front edge 324A of the bottom wall 322 of the shell 306 and between the first side wall 314 and the second side wall 316 of the shell 306. For example, the first gas distributing portion 348A may have a configuration (e.g., length, location relative to the front opening 312, relative location in or along the interior space, etc.) similar to the first gas distributing portion 48A of FIG. 2A as discussed above.

Figure 6B:
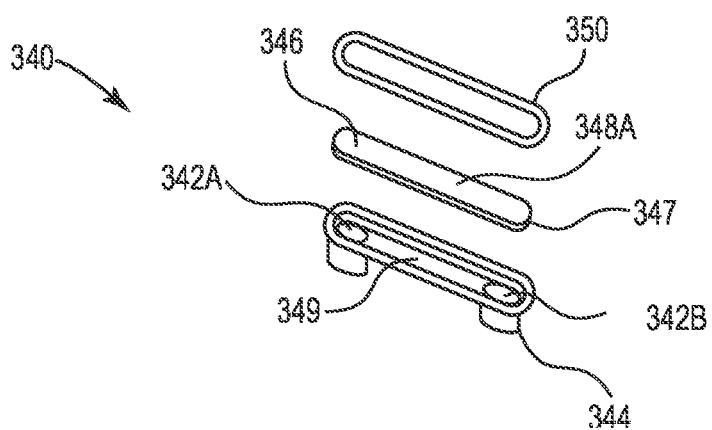
FIG. 6B is an exploded view of a manifold of the substrate container in FIG. 6A, according to an embodiment.

FIG. 6B is an exploded view of the manifold 340. The manifold 340 includes an inlet 342A, a frame 344, a membrane 347, a channel 349, and a cover 350. The inlet 342A is attached to the first front port 334A in the bottom wall 322 of the shell 306. The membrane 347 is held in place between the cover 350 and the frame 344. In various embodiments, the membrane 347 may be attached to the frame 344 in a different manner than with the cover 350. For example, the membrane 347 in an embodiment may be attached to the frame 344 by ultrasonic welding, being mechanically captured in a torturous path (e.g., with the cover 350), or by laser welding.

The membrane 347 can be, for example, a porous material. In an embodiment, the porous material may be one of a non-woven polymer, a sintered polymer material, or a polymer membrane. The membrane 347 includes one or more polymers. The polymer(s) of the membrane 347 are those suitable for use in handling of semiconductor wafers, such as, but not limited to polytetrafluoroethylene (PTFE), unsaturated polyethylene (UPE), and polyethylene. In an embodiment, the sintered material or the nonwoven polymer may be used instead of the membrane 347.

The channel 349 fluidly connects to the first inlet 342A and is disposed underneath the membrane 347. The purge gas entering through the first inlet 342A flows into the channel 349 and then exits the manifold 340, passing through the membrane 347, and then flowing from the manifold 340 through the gas distributing surface 346 of the membrane 347.

The frame 344 attaches to the bottom wall 322 of the shell 306 within substrate container 300. For example, the frame 344 can be at least partially disposed in the bottom wall 322 of the shell 306 as shown in FIG. 6A. In an embodiment, the frame 344 may be integrally formed with the shell 306. In such an embodiment, frame 344 may be formed as an integral part of the bottom wall 322 of the shell 306 (e.g., the shell 306 being molded to include the frame 344).

The substrate container 300 includes a second front port 334B disposed in the bottom wall 322 of the shell 306. The second inlet 342B of the manifold 340 is attached to the second front port 334B. As shown in FIG. 6A, the second front port 334B is disposed in the bottom wall 322 of the shell 306 between the inlet 342A the second side wall 316. In an embodiment, the second front port 334B is configured as an outlet port for discharging gas from the interior space 308. In such an embodiment, purge gas cycled through the enclosed interior space 308 (e.g., when the front door 4 is closed) by supplying purge gas through one or more rear ports 336A, 336B and discharging the purge gas from the enclosed interior space 308 through the manifold 340 and second front port 334B. In some cases, rear ports 336A, 336B can be fitted with a purge gas manifold or purge tower such as is shown, for example, in FIG. 7, to facilitate the supply of purge gas into the interior space 308.

In some cases, a valve such as, for example, a check valve can be incorporated into the second front port 334B that will open upon an application of positive pressure from within the interior space of the substrate container 308 to facilitate the exhaustion of purge gas through the second front port 334B. In other embodiments, each of the first and second front ports 334A, 334B can be configured such that they can operate as both an inlet port and/or an outlet port depending on the application. In one example, each of the first and/or second front ports 334A, 334B can include a valve such as, for example, an umbrella style valve, that opens in a first direction or a second direction depending on the direction of air flow through the valve.

In various embodiments, the second front port 34B in the substrate container 1 of FIGS. 1-3 may be similarly configured as an outlet port.

Figure 7A:
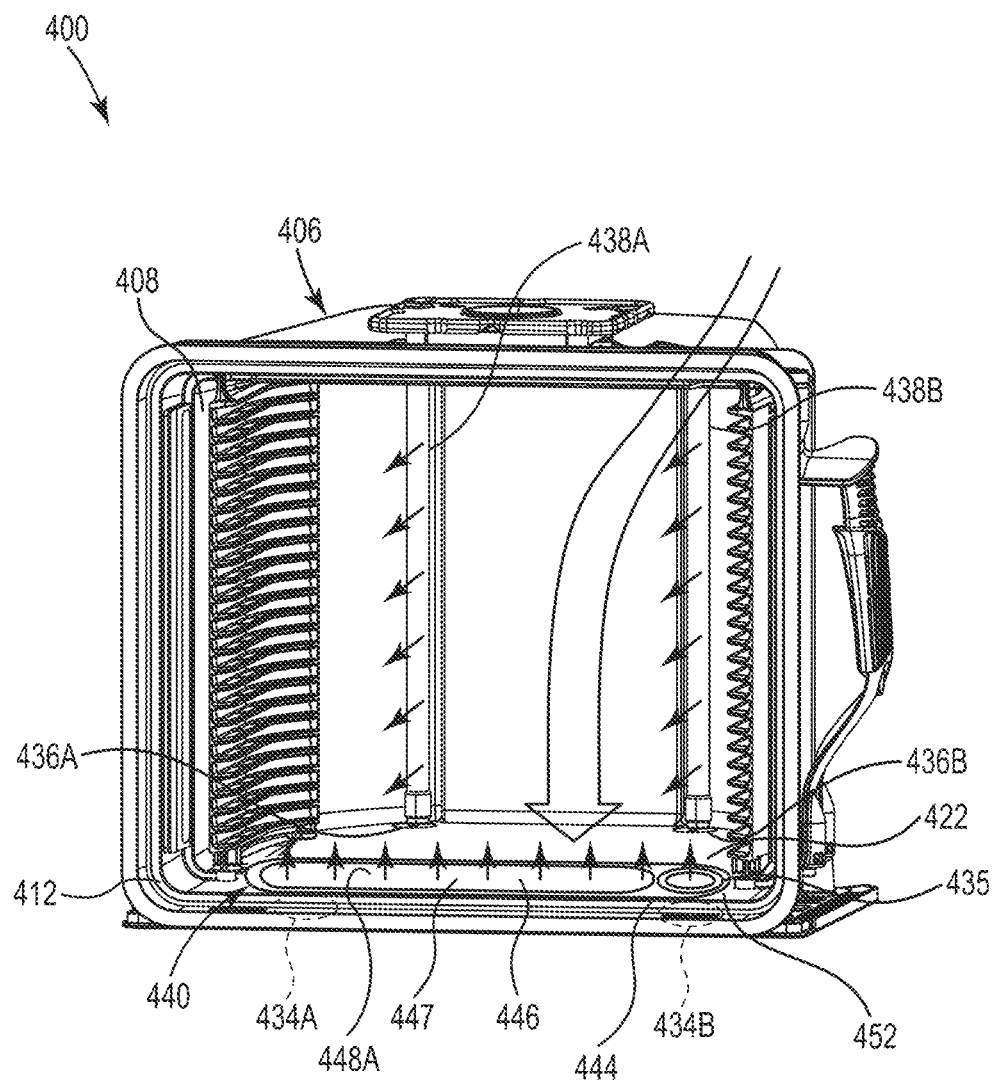
FIG. 7A is a front perspective view of an embodiment a substrate container.

FIG. 7A is a front perspective view of an embodiment of a substrate container 400. The front door of the substrate container 400 is removed in FIG. 7 (e.g., the substrate container 400 is open). The substrate container 400 is closed with a front door similar to the front door 4 in FIG. 1.

The substrate container 400 includes a shell 406 and a front manifold 440. The substrate container 400 can have a similar structure and configuration to substrate container 1 in FIGS. 1-3, except with respect to a front manifold 140 provided in FIGS. 1-3 and front manifold 440 in FIG. 7A. For example, the substrate container 400 includes an interior space 408, a front opening 412, a bottom wall 422, and ports 434A, 434B, 436A, 436B in the bottom wall 422 of the shell 406 similar to the substrate container 1 in FIGS. 1-3. In an embodiment, the shell 406 may have features (e.g., additional inlets, single rear inlet, slots, etc.) as similarly discussed above with respect to the substrate container 1 in FIGS. 1-3. As shown in FIG. 7A, the rear ports 436A, 436B can each be provided with a gas distributing manifold 438A, 438B, which helps increase the distribution of the purge gas supplied to the respective rear port 436A, 436B along the height of the interior space 408.

The manifold 440 includes a frame 444 and a membrane 447. The membrane 447 includes a gas distributing surface 446. A stream of purge gas is supplied to substrate container 400 through a first front port 434A and is distributed by the gas distributing surface 446 of the manifold 440 into the interior space 408, in a similar manner as discussed above with respect to the substrate container 300 in FIG. 6A. The purge gas flows through the membrane 447 and is described into interior space 408 from the gas distributing surface 446. The gas distributing surface 446 includes a first distributing surface portion 448A that extends along the front opening 412 in a similar manner as discussed above for the first distributing surface portion 348A in FIG. 6A.

The substrate container 400 includes a second front port 434B in the bottom wall 422 of the shell 406. The second front port 434B is for discharging gas (e.g., purge gas) from the interior space 408 as similar discussed above with respect to the second front port 334B in the substrate container 300 of FIG. 6A. The frame 444 includes a flange 452 that brackets a lip 435 of the second front port 434B. The manifold 440 does not cover the second front port 434B. For example, the gas in the interior space 408 can flow into and through the second front port 434B without passing through the membrane 447 or the gas distributing surface 446.

Figure 7B:
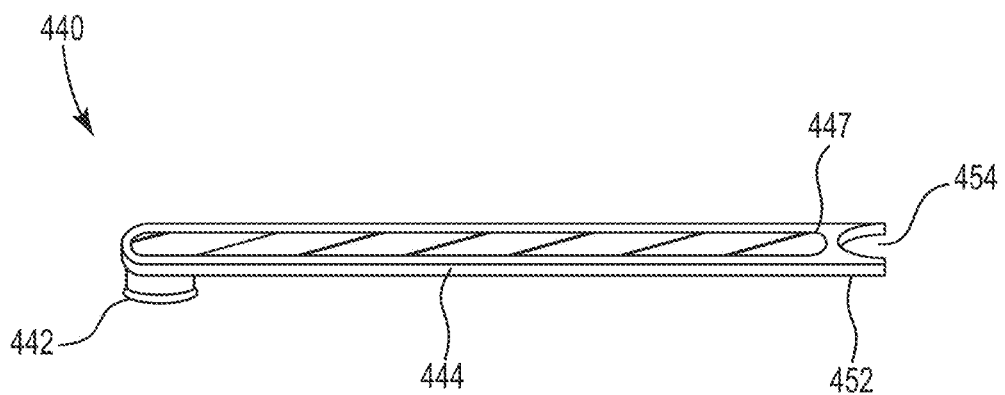
FIG. 7B is a front perspective view of a manifold of the substrate container in FIG. 7A, according to an embodiment.

FIG. 7B shows a front perspective view of the front manifold 440. The manifold includes an inlet 442, the frame 444, and the membrane 447. The inlet 442 is attached to the first front port 434A in the shell 406. The flange 452 includes an opening 454. When installed into the substrate container 400, the lip 435 of the second front port 434B is fit into the opening formed by the flange 452, which secures the frame 444 in place and helps prevent accidental detachment or movement of the front manifold 440. In an embodiment, the membrane 447 may be attached to the frame 444 by one of ultrasonic welding, being mechanically captured in a torturous path (e.g., with the cover 350), or laser welding.

The membrane 447 is an example of a porous material. In an embodiment, the porous material may be one of a non-woven polymer, a sintered polymer material, and a polymer membrane (e.g., membrane 447). The membrane 447 includes one or more polymers. The polymer(s) of the membrane 447 are those suitable for use in handling of semiconductor wafers, such as, but not limited to polytetrafluoroethylene (PTFE), unsaturated polyethylene (UPE), and polyethylene. In an embodiment, the sintered material or the nonwoven polymer may be used instead of the membrane 447.

Figure 8A:
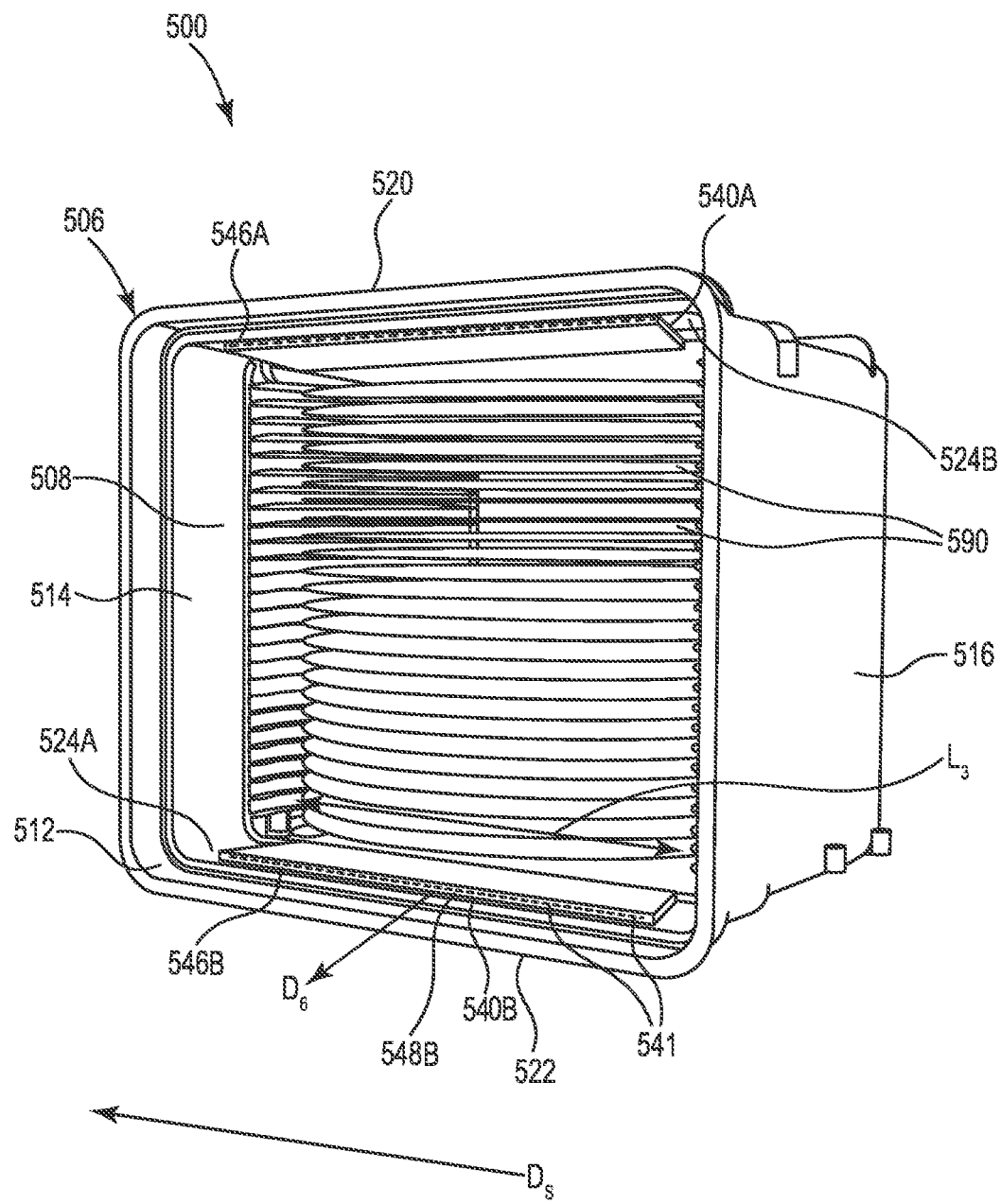
FIG. 8A is a front perspective view of an embodiment a substrate container.
Figure 8B:
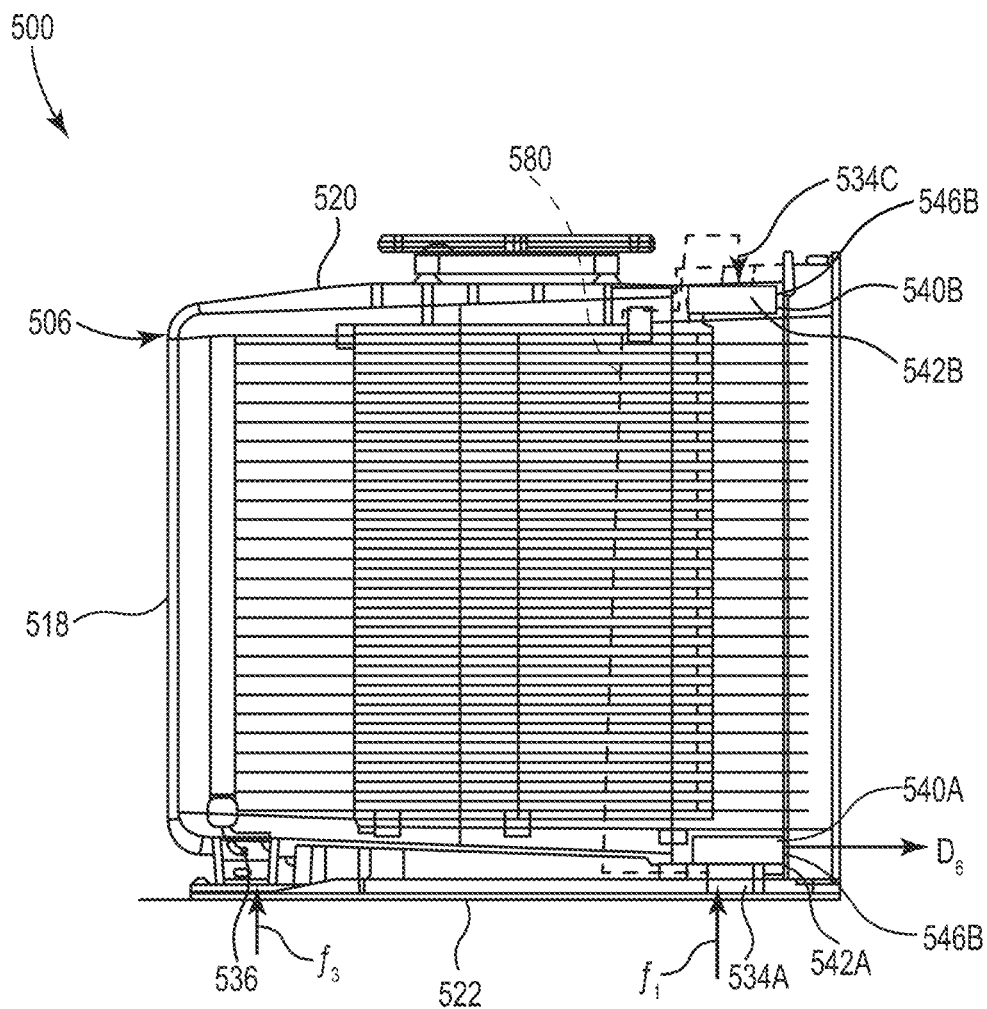
FIG. 8B is a cross-sectional view of the substrate container of FIG. 8A, according to an embodiment.

FIG. 8A is a front perspective view of an embodiment of a substrate container 500. FIG. 8B is a cross sectional view of the substrate container 500, according to an embodiment. The front door of the substrate container 500 is removed in FIGS. 8A and 8B (e.g., the substrate container 500 is open). For example, the substrate container 500 can be closed with a front door (not shown), similar to the front door 4 in FIG. 1.

As shown in FIG. 8A, the substrate container 500 includes a shell 506, a first front manifold 540A, and a second front manifold 540B. The substrate container 500 can generally have a similar structure and configuration to substrate container 1 in FIGS. 1-3, except with respect to a front manifolds 540A, 540B. For example, the substrate container 500 includes an interior space 508, a front opening 512, a first wall 514, a second wall 516, a top 520 with a front edge 524B, a bottom wall 522 with a front edge 524A, and ports 534A, 536 in the bottom wall 522 of the shell 506 similar to the substrate container 1 in FIGS. 1-3. In an embodiment, the shell 506 may have features (e.g., additional inlets, single rear inlet, slots, etc.) as similarly discussed above with respect to the substrate container 1 in FIGS. 1-3. As shown in FIG. 8A, the rear port 536 can be provided with a gas distributing manifold 538 to help distribute the purge gas supplied to the rear port 536.

As shown in FIG. 8A, the first manifold 540A is attached to the bottom wall 522 and the second manifold 540B is attached to the top wall 520. The first and second manifolds 540A, 540B each include a gas distributing surface 546A, 546B that extends in a direction $D_S$ between the first and second side walls 514, 516. The gas distributing surface 546A of the first manifold 540A also extends along the front edge 524A of the bottom wall 522, and the gas distributing surface 546B of the second manifold 540B also extends along the front edge 524B of the top wall 520.

The gas distributing surface 546A of the first manifold 540A has a first gas distributing portion 548A with at least one slit for distributing purge gas. The slit 541 can extend along the length $L_3$ of the first gas distributing portion 548A. Slit 541 is configured to expel a jet of purge gas at high velocity (e.g. air speeds greater than 0.3 m/s) that can entrain and direct surrounding air and direct the flow of the surrounding air. In some embodiments, the first gas distributing portion 548A can include a plurality of slits 541 distributed along a length of the first gas distributing surface.

As shown in FIG. 8B, the substrate container 500 includes a plurality of inlet ports 534A, 536 for supplying purge gas into the interior space 508. For example, the substrate container 500 is configured to be supplied with a first stream of purge gas $f_1$ through a first inlet port 534A. Another stream of purge gas $f_3$ is also supplied to the rear inlet port 536 (one rear inlet port is obscured in FIG. 8A).

The manifold 540A is configured to distribute purge gas supplied through the first front inlet port 534A. An inlet 542A of the manifold 540A receives purge gas via the first inlet port 534A and the distributing surface 546A of the manifold 540A distributes the purge gas into the interior space 508. Jets of purge gas are expelled at high velocity (e.g. air speeds greater than 0.3 m/s) from the slits 541 of the distributing surface 546A into the interior space 508 in a forward direction $D_6$. For example, purge gas may be dispersed from first gas distributing portion 548A of the distributing surface 546A. In an embodiment, the jets of purge gas may be expelled at an angle.

The second manifold 540B may have a similar configuration to the first manifold 540A, except for being attached to the top wall 520 of the shell 506. In an embodiment, internal passageways 580 in the shell 506 may supply a portion of the purge gas of the first stream of purge gas $f_1$ to an inlet 542B of the second manifold 540B. Alternatively, a stream of purge gas may be supplied through an inlet port 534C in the top wall 520 of the shell 506.

Figure 9A:
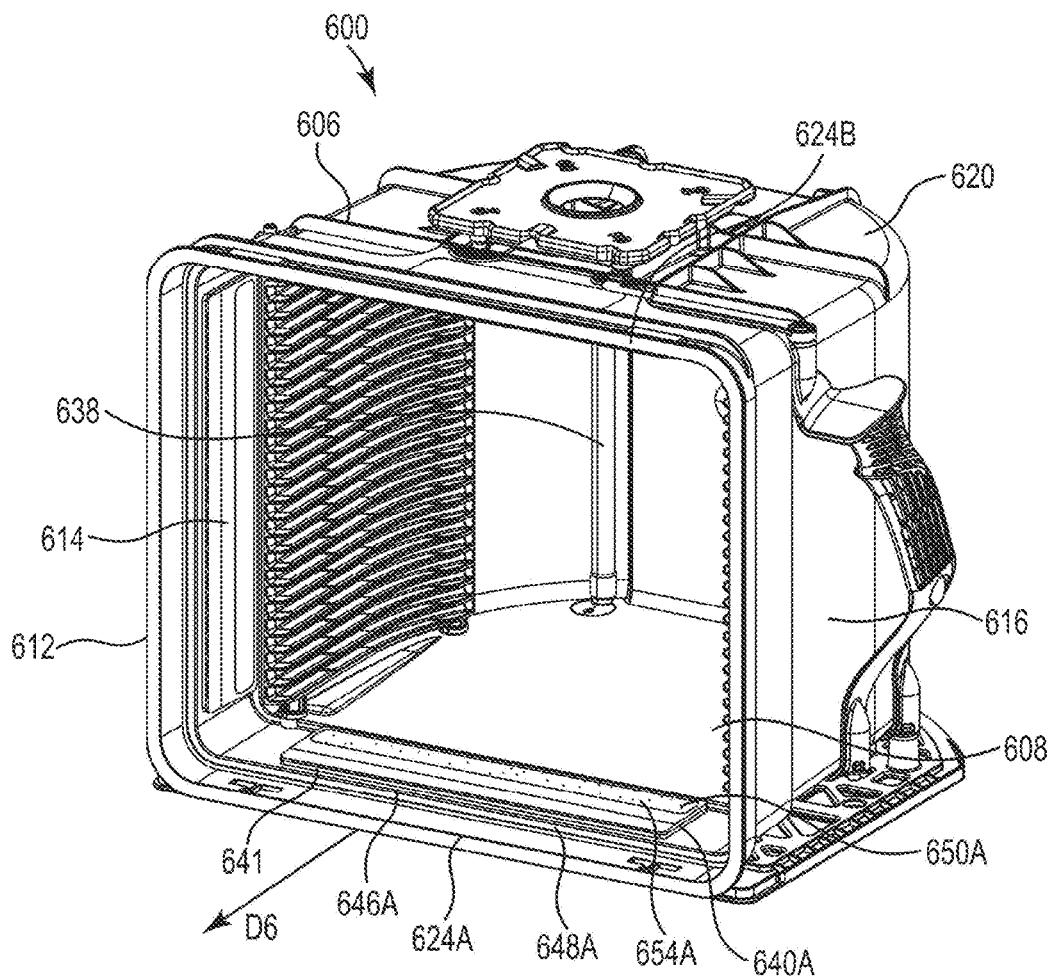
FIG. 9A is a front perspective view of an embodiment of a substrate container.
Figure 9B:
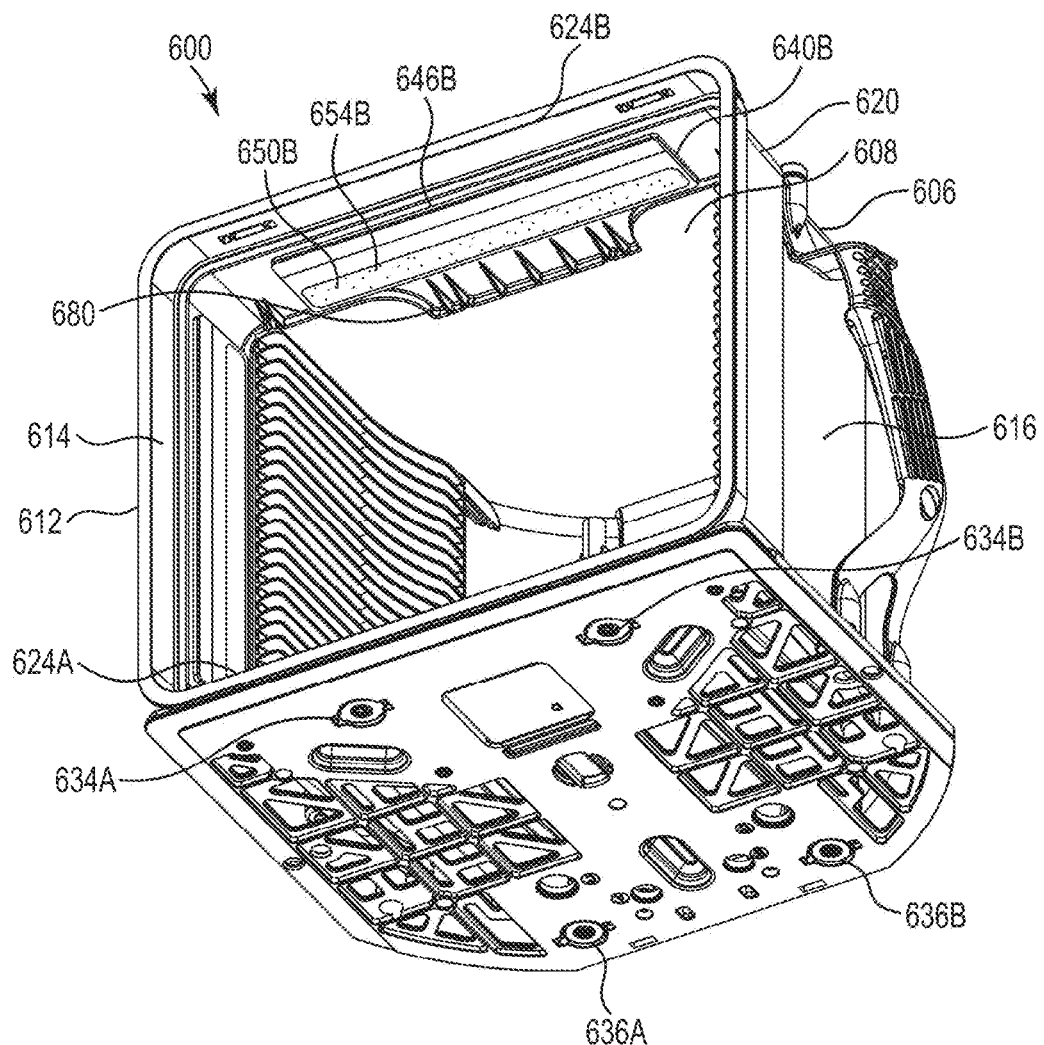
FIG. 9B is a bottom perspective view of the substrate container of FIG. 9A.

FIGS. 9A and 9B show different views of a substrate container 600 according to yet another embodiment of the disclosure. The front door of the substrate container 600 is removed in FIGS. 9A and 9B (e.g., the substrate container 600 is open). For example, the substrate container 600 can be closed with a front door (not shown), similar to the front door 4 in FIG. 1.

As shown in FIG. 9A, the substrate container 600 includes a shell 606, a first manifold 640A, and a second manifold 640B. The substrate container 600 can generally have a similar structure and configuration to substrate container 1 in FIGS. 1-3, except with respect to a front manifolds 640A, 640B. For example, the substrate container 600 includes an interior space 608, a front opening 612, a first wall 614, a second wall 616, a top wall 620 with a front edge 624B, a bottom wall 622 with a front edge 624A, and ports 634A, 634B, 636A, 636B in the bottom wall 622 of the shell 606 similar to the substrate container 1 in FIGS. 1-3. In an embodiment, the shell 606 may have features (e.g., additional inlets, single rear inlet, slots, etc.) as similarly discussed above with respect to the substrate container 1 in FIGS. 1-3. Ports 634A, 634B, 636A, 636B that can be used to supply purge gas into the interior space 608 and, in some embodiments, exhaust gas from the interior space 608. At least one of the rear ports 636A, as best seen in FIG. 9A, can be provided with a gas distributing manifold 638 to help distribute the purge gas supplied to the rear port 636A.

As shown in FIG. 9A, the first manifold 640A is attached to the bottom wall 622 and the second manifold 640B is attached to the top wall 620. The first and second manifolds 640A, 640B each include a gas distributing surface 646A, 646B that extends in a direction between the first and second side walls 614, 616. The gas distributing surface 646A of the first manifold 640A also extends along the front edge 624A of the bottom wall 622, and the gas distributing surface 646B of the second manifold 640B also extends along the front edge 624B of the top wall 620.

The gas distributing surface 646A of the first manifold 640A has a gas distributing portion 648A with a plurality of slits 641 for distributing purge gas. The slits 641 are provided along the length of the first gas distributing portion 648A. Each slit 641 is configured to expel a jet of purge gas at high velocity that can entrain and direct surrounding air and direct the flow of the surrounding air. The gas distribution portion 648A of manifold 640A receives purge gas via the first inlet port 634A and the distributing surface 646A of the manifold 640A distributes the purge gas into the interior space 608. Jets of purge gas are expelled at high velocity from the slits 641 of the distributing surface 646A into the interior space 608 in a forward direction $D_6$. In one embodiment, purge gas may be dispersed from first gas distributing portion 648A of the gas distributing surface 646A. In another embodiment, the jets of purge gas may be expelled at an angle.

In an embodiment, the manifold 640A also can include a gas diffusion portion 650A which is configured to facilitate exhaustion of purge gas from the interior 606 through the manifold 640A and port 634B when the container is closed. The gas diffusion portion 650A can include a gas diffusion surface 654A which can be porous. For example, in one embodiment, the gas diffusion surface 654A can include a porous membrane, such as described herein. In another embodiment, the gas diffusion surface 654A can include a porous ceramic or a sintered porous material. Positive pressure within the interior 606 of the substrate container 600 creates a pressure gradient between the interior 606 of the substrate container 600 and the exterior which causes the purge gas to enter the manifold 640A through the diffusion surface 654A of the diffusion portion 650A and exit the container.

The second manifold 640B may have a similar configuration to the first manifold 640A, except for being attached to the top wall 620 of the shell 606. In an embodiment, internal passageways 680 in the shell 606 may supply a portion of the purge gas of the first stream of purge gas to an inlet of the second manifold 640B. Alternatively, a stream of purge gas may be supplied through an inlet port in the top wall 620 of the shell 606 (not shown).

Additionally, in an embodiment, the manifold 640B also can include a gas diffusion portion 650B which is configured to facilitate exhaustion of purge gas from the interior 606 through the manifold 640B and an outlet port in the top wall 620 when the container is closed. The gas diffusion portion 650B can include a gas diffusion surface 654B which can be porous. For example, in one embodiment, the gas diffusion surface 654B can include a porous membrane, such as described herein. In another embodiment, the gas diffusion surface 654B can include a porous ceramic or a sintered porous material. Positive pressure within the interior 606 of the substrate container 600 creates a pressure gradient between the interior 606 of the substrate container 600 and the exterior which causes the purge gas to enter the manifold 640B through the diffusion surface 654B of the diffusion portion 650B and exit the container.

Figure 10:
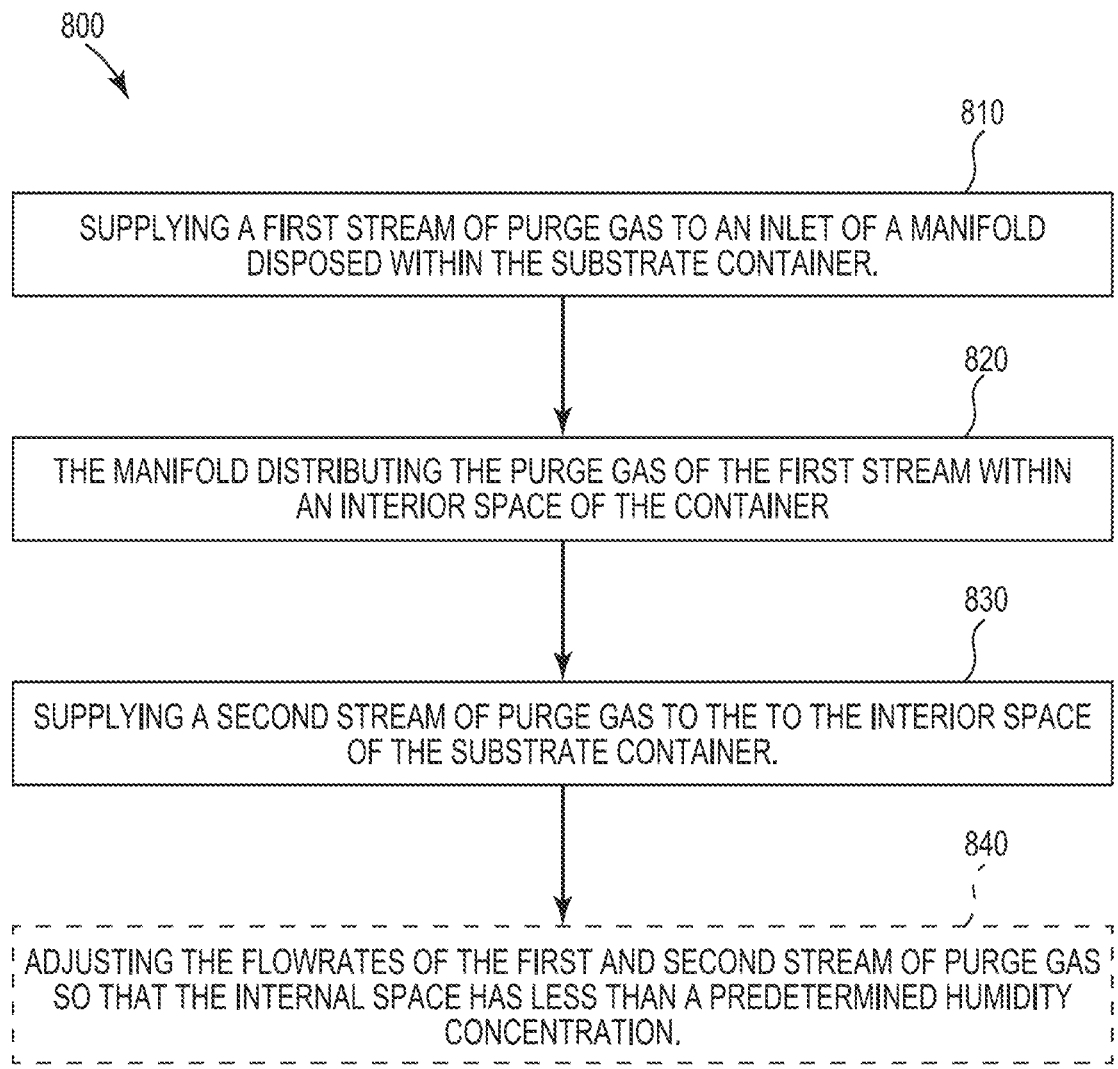
FIG. 10 is a block diagram of an embodiment of a method of purging a substrate container.

FIG. 10 is a block diagram of an embodiment of a method 800 of purging a front opening substrate container when open (e.g., substrate container 1 as shown in in FIG. 2A, or any of substrate containers 300, 400, 500). For example, the substrate container is open when the front door (e.g., front door 4) has been removed from the front opening (e.g., front opening 12, 312, 412, 512) of the substrate container. The method starts at 810.

At 810, a first stream of purge gas (e.g., first stream of purge gas $f_1$) is supplied to an inlet of a manifold (e.g., manifold 40, 140, 240, 340, 440, 540A, 540B) within the substrate container. The first stream of purge gas is supplied to an inlet of the manifold (e.g., inlet 42A) via a first inlet port (e.g., inlet port 34A, 34B) in one of the walls of the substrate container (e.g., bottom wall 22, top wall 520). The manifold is disposed closer to the front opening than a rear wall of the substrate container (e.g., rear wall 18). The method then proceeds to 820.

At 820, the manifold distributes the purge gas of the first stream within an interior space (e.g., interior space 108) of the substrate container. In an embodiment, 820 may include the manifold distributing a portion of the purge gas in a direction (e.g., direction $D_2$) towards the front opening of the substrate container. The method then proceeds to 830.

At 830, a second stream of purge gas (e.g., second stream of purge gas $f_2$) is supplied to the interior space of the substrate container via a second inlet port disposed in a wall of the substrate container (e.g., bottom wall 22). The second inlet port being disposed closer to a rear wall of the substrate container (e.g., rear wall 18) than the front opening of the substrate container. In an embodiment, the first inlet port and the second inlet port may be disposed in the same wall of the substrate container.

Optionally, the method may include 840 after 830, as shown in FIG. 10. The flowrates of the first and second stream of purge gas can be adjusted so that the internal space has less than a predetermined humidity concentration. Less than a predetermined amount of humidity is desired for the interior space of the substrate container. This predetermined amount may be based on, for example, the materials of the substrates. humidity within the interior space substrate container, which can be undesirable.

In an embodiment, the method 800 may be modified based on one or more of the substrate containers and manifolds disclosed in FIGS. 1-8B and as described above.

In embodiments where at least one of the manifolds is configured as an outlet to exhaust purge gas from the substrate container, a method can include introducing one or more streams of a purge gas into the interior of the substrate container. The purge gas can be introduced into the substrate container by one or more manifolds that include an inlet a gas distributing surface. Alternatively or additionally, the purge gas can be introduced into the substrate container by a purge gas inlet or purge gas tower. The purge gas is then exhausted from the interior of the substrate container via at least one manifold configured as an outlet manifold as described herein according to the various embodiments. In some embodiments, the manifold includes an outlet connected to a port of the substrate container and a gas diffusion surface. When the door of the substrate container is used to seal the interior, the purge gas within the interior of the substrate container can achieve a positive pressure. When the positive pressure reaches a predetermined threshold, purge gas diffuses through the gas diffusion surface of the manifold and is exhausted from the container via the outlet port connected to a port in the substrate container wall.

Aspects

Any of aspects 1-15 can be combined with any of aspects 16 and 17.

Aspect 1. A substrate container, comprising: a shell defining an interior space, the shell including a front opening, a first side wall, a second side wall, a rear wall, and a bottom wall including a front edge extending between the first side wall and the second side wall along the front opening of the shell; and a manifold attached to the bottom wall closer to the front opening of the shell than the rear wall, the manifold including: an inlet configured to receive a first stream of purge gas; and a gas distributing surface configured to distribute the first stream of purge gas into the interior space, the gas distributing surface including a first gas distributing portion extending in a direction between the first side wall and the second side wall along the front edge of the bottom wall.

Aspect 2. The substrate container of aspect 1, wherein the inlet of the manifold is attached to an inlet port in the bottom wall of the shell.

Aspect 3. The substrate container of either one of aspects 1 or 2, wherein the first gas distributing portion has a length that extends along a majority of a distance between the first side wall and the second side wall.

Aspect 4. The substrate container of any one of aspects 1-3, wherein the first gas distributing portion is configured to distribute at least a portion of the purge gas in a direction towards the front opening of the shell.

Aspect 5. The substrate container of any one of aspects 1-4, wherein the gas distributing surface comprises a porous material.

Aspect 6. The substrate container of any one of aspects 1-5, wherein the gas distributing surface includes a plurality of openings arranged along a length of the gas distributing surface between the first side wall and the second side wall.

Aspect 7. The substrate container of any one of aspects 1-6, further comprising: a plurality of shelves for supporting a plurality of substrates configured to hold substrates, the manifold being closer to the front opening than the shelves.

Aspect 8. The substrate container of any one of aspects 1-7, wherein the bottom wall has an interior surface that faces the interior space, and the manifold is configured to distribute the purge gas from the gas distributing surface at an angle relative to the interior surface of the bottom wall.

Aspect 9. The substrate container of any one of aspects 1-8, wherein the gas distributing surface includes a second gas distributing portion that extends along one of a front edge of the first side wall or a front edge of the second side wall.

Aspect 10. The substrate container of any one of aspects 1-9, wherein the gas distributing surface is at least partially disposed within the interior space.

Aspect 11. The substrate container of any one of aspects 1-10, wherein the manifold includes a frame that supports the gas distributing surface.

Aspect 12. The substrate container of any one of aspects 1-11, further comprising: an outlet port for discharging gas from the interior space, the outlet port being disposed in the bottom wall between the first inlet and the second side wall, and the first gas distributing portion extending between the inlet and the outlet port.

Aspect 13. The substrate container of aspect 12, wherein the manifold includes a second inlet attached to the outlet port.

Aspect 14. The substrate container of any one of aspects 1-13, wherein the shell includes a rear wall opposite to the front opening, and the bottom wall includes a rear inlet port for introducing a second stream of purge gas into the interior space, the rear inlet port being disposed near the rear wall than the front opening.

Aspect 15. The substrate container of any one of aspects 1-14, further comprising: a door configured to be received within the front opening defined by the shell to enclose the interior space.

Aspect 16. A method of purging a substrate container when having a front opening that is open, comprising: supplying, via a front inlet port disposed in a wall of the substrate container, a first stream of purge gas to an inlet of a manifold disposed within the substrate container, the manifold being disposed closer to the front opening than a rear wall of the substrate container; distributing, via the manifold, the purge gas of the first stream within an interior space of the substrate container; and supplying, via a second inlet port in a wall of the substrate container, a second stream of purge gas to the to the interior space of the substrate container, the second inlet port being disposed closer to the rear wall of the substrate container than the front opening of the substrate container.

Aspect 17. The method of aspect 16, wherein distributing the purge gas within an interior space of the substrate container includes: the manifold directing a portion of the purge gas in a direction towards the front opening of the substrate container.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in the details, particularly in matters of shape, size, and arrangement of parts without exceeding the scope of the disclosure. The disclosure's scope is, of course, defined in the language in which the appended claims are expressed.

What is claimed is:

1. A substrate container, comprising:
 a shell defining an interior space, the shell including a front opening, a first side wall, a second side wall, a rear wall, a bottom wall, and a front edge extending between opposing walls along the front opening of the shell; and
 a manifold attached at the bottom wall, the top wall, the first sidewall and/or the second side wall closer to the front opening of the shell than the rear wall, the manifold including:
  an inlet configured to receive a stream of purge gas; and
  a gas distributing portion including a gas distributing surface configured to distribute the stream of purge gas into the interior space, the gas distributing portion including the gas distributing surface extending in a direction between opposing walls along a front edge of the shell, wherein the gas distributing surface includes a plurality of openings arranged along a length of the gas distributing surface between opposing walls.

2. The substrate container of claim 1, wherein the inlet of the manifold is attached to an inlet port in the bottom wall of the shell.

3. The substrate container of claim 1, wherein the gas distributing portion has a length that extends along a majority of a distance between the first side wall and the second side wall.

4. The substrate container of claim 1, wherein the gas distributing surface is configured to distribute at least a portion of the purge gas in a direction towards the front opening of the shell by the plurality of openings.

5. The substrate container of claim 1, wherein the gas distributing surface comprises a porous material.

6. The substrate container of claim 1, wherein the manifold includes an outlet configured to facilitate exhaustion of the purge gas from the interior space of the substrate container.

7. The substrate container of claim 1, wherein each of the bottom wall, top wall, first side wall or second side wall has an interior surface that faces the interior space, and the manifold is configured to distribute the purge gas from the gas distributing surface at an angle relative to the interior surface of respective bottom wall, top wall, first side wall or second side wall to which it is attached.

8. The substrate container of claim 1, wherein the manifold includes at least a first gas distributing portion having a gas distributing surface that extends along the front edge of the first side wall and a second gas distributing portion having a gas distributing surface that extends along one of a front edge of the second side wall of the shell, wherein the first side wall is opposite the second side wall of the shell.

9. The substrate container of claim 1, wherein the manifold includes a frame that supports the gas distributing portion including the gas distributing surface.

10. The substrate container of claim 1, further comprising:
an outlet port for discharging gas from the interior space, wherein the gas distributing portion extends between the inlet and the outlet port.

11. The substrate container of claim 1, wherein the manifold further comprises a gas diffusion portion connected to an outlet port for discharging gas from the interior space.

12. The substrate container of claim 1, wherein
the rear wall is opposite to the front opening, and
the bottom wall includes a rear inlet port for introducing an additional stream of purge gas into the interior space, the rear inlet port being disposed near the rear wall than the front opening.

13. The substrate container of claim 1, further comprising:
a door configured to be received within the front opening defined by the shell to enclose the interior space.

14. A substrate container, comprising:
a shell defining an interior space, the shell including a front opening, a first side wall, a second side wall, a rear wall, a top wall, a bottom wall and including a front edge extending between opposing walls along the front opening of the shell, and a port in the bottom wall and/or the top wall of the shell; and
a manifold attached to the shell near the front opening, the manifold including:
a gas diffusion portion including a gas diffusion surface configured to permit the diffusion of the stream of purge gas from the interior space into the manifold, the gas diffusion portion including the gas diffusion surface extending in a direction between the first side wall and the second side wall of the shell, the gas diffusion surface comprising a plurality of openings configured to release gas in a same direction; and
an outlet coupled to the at least one port in the shell, the outlet configured to exhaust the purge gas from the manifold to the port in the shell to an exterior of the substrate container.

15. The substrate container of claim 14, wherein the manifold is attached to the port in the bottom wall or the top wall of the shell.

* * * * *